US012635466B2

(12) United States Patent
Ando et al.

(10) Patent No.: US 12,635,466 B2
(45) Date of Patent: May 19, 2026

(54) CERAMIC PLATE

(71) Applicant: NGK INSULATORS, LTD., Nagoya (JP)

(72) Inventors: Takahiro Ando, Nagoya (JP); Shinsuke Yuda, Nagoya (JP); Koichi Yoshino, Nagoya (JP); Akiyoshi Hattori, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 137 days.

(21) Appl. No.: 18/599,475

(22) Filed: Mar. 8, 2024

(65) Prior Publication Data

US 2025/0069930 A1 Feb. 27, 2025

Related U.S. Application Data

(63) Continuation of application No. PCT/JP2023/030466, filed on Aug. 24, 2023.

(51) Int. Cl.
*H01T 23/00* (2006.01)
*C04B 37/02* (2006.01)
*H01L 21/683* (2006.01)

(52) U.S. Cl.
CPC ........ *H01L 21/6833* (2013.01); *C04B 37/021* (2013.01); *C04B 2237/343* (2013.01); *C04B 2237/40* (2013.01); *C04B 2237/60* (2013.01); *C04B 2237/68* (2013.01)

(58) Field of Classification Search
None
See application file for complete search history.

(56) References Cited

U.S. PATENT DOCUMENTS

| | | | |
|---|---|---|---|
| 5,393,715 A | 2/1995 | Nakahata et al. | |
| 6,403,199 B2 * | 6/2002 | Mori | C04B 35/053 |
| | | | 428/209 |
| 11,830,753 B2 | 11/2023 | Miyanishi et al. | |
| 2009/0004438 A1 * | 1/2009 | Urakawa | B32B 18/00 |
| | | | 501/134 |
| 2010/0003479 A1 * | 1/2010 | Hwang | B32B 18/00 |
| | | | 428/213 |
| 2017/0117175 A1 | 4/2017 | Katsuda et al. | |

(Continued)

FOREIGN PATENT DOCUMENTS

| | | |
|---|---|---|
| JP | H06-128041 A | 5/1994 |
| JP | 2002-270454 A | 9/2002 |

(Continued)

OTHER PUBLICATIONS

International Search Report and Written Opinion dated Oct. 10, 2023 (Application No. PCT/JP2023/030466).

(Continued)

*Primary Examiner* — Stephen W Jackson
(74) *Attorney, Agent, or Firm* — BURR PATENT LAW, PLLC

(57) ABSTRACT

Provided is a ceramic plate including the ceramic substrate containing aluminum oxide and/or aluminum nitride; the inner electrode embedded inside the ceramic substrate containing an electrode base material, a thermal expansion coefficient modifier, and Ti; and wherein the ceramic substrate has a Ti diffusion region in which Ti is diffused around the inner electrode.

11 Claims, 2 Drawing Sheets

(56)     References Cited

U.S. PATENT DOCUMENTS

| | | |
|---|---|---|
| 2020/0407279 A1 | 12/2020 | Atsuji et al. |
| 2022/0081365 A1 | 3/2022 | Atsuji et al. |
| 2023/0245918 A1 | 8/2023 | Narazaki |

FOREIGN PATENT DOCUMENTS

| | | |
|---|---|---|
| JP | 2022-048078 A | 3/2022 |
| JP | 2022-048679 A | 3/2022 |
| WO | 2016/042957 A1 | 3/2016 |
| WO | 2019/188148 A1 | 10/2019 |
| WO | 2022/014410 A1 | 1/2022 |

OTHER PUBLICATIONS

English translation of the International Search Report dated Oct. 10, 2023 (Application No. PCT/JP2023/030466).

\* cited by examiner

EPMA
Ti

CERAMIC PLATE

CROSS-REFERENCE TO RELATED APPLICATION

This application is a continuation application of PCT/JP2023/030466 filed Aug. 24, 2023, the entire contents of which are incorporated herein by reference.

BACKGROUND OF THE INVENTION

1. Field of the Invention

The present invention relates to a ceramic plate.

2. Description of the Related Art

In film deposition and etching systems for semiconductor manufacturing processes, a susceptor is used to support a wafer. Such a susceptor generally has a structure in which an inner electrode such as a heater electrode, an electrostatic chuck (ESC) electrode, and an RF electrode is embedded inside a ceramic substrate.

Patent Literature 1 (WO2019/188148) discloses a susceptor including a body portion made of a sintered composite containing aluminum oxide and magnesium-aluminum spinel and an inner electrode disposed inside the body portion. Patent Literature 2 (JP2022-48078A) discloses a sintered composite including a substrate containing aluminum oxide as a main material and an electrode containing ruthenium, zirconium oxide, and aluminum oxide disposed inside or on a surface of the substrate. Patent Literature 3 (JP2022-48679A) discloses a sintered composite including a substrate containing a ceramic as a main material and an electrode containing tungsten and zirconium oxide disposed inside or on a surface of the substrate.

CITATION LIST

Patent Literature

Patent Literature 1: WO2019/188148
Patent Literature 2: JP2022-48078A
Patent Literature 3: JP2022-48679A

SUMMARY OF THE INVENTION

Now, to ensure high performance in semiconductor manufacturing device applications such as susceptors, it is desired to increase adhesive strength between a ceramic substrate and an inner electrode embedded therein.

The present inventors have now found that the adhesive strength between the ceramic substrate and the inner electrode can be improved by including Ti in materials constituting the inner electrode and by forming a Ti diffusion region in which Ti is diffused around the inner electrode.

Therefore, an objective of the present invention is to provide a ceramic plate having improved adhesive strength between the ceramic substrate and the inner electrode.

The present invention provides the following aspects.

Aspect 1

A ceramic plate comprising:
a ceramic substrate comprising aluminum oxide and/or aluminum nitride; and an inner electrode embedded inside the ceramic substrate, the inner electrode comprising an electrode base material, a thermal expansion coefficient modifier, and Ti, wherein the ceramic substrate comprises a Ti diffusion region in which Ti is diffused around the inner electrode.

Aspect 2

The ceramic plate according to aspect 1, wherein the electrode base material is at least one selected from the group consisting of Mo, W, WC, MoC, Nb, NbC, and Ru.

Aspect 3

The ceramic plate according to aspect 1 or 2, wherein the electrode base material is Mo.

Aspect 4

The ceramic plate according to any one of aspects 1 to 3, wherein the thermal expansion coefficient modifier comprises aluminum oxide and/or aluminum nitride.

Aspect 5

The ceramic plate according to any one of aspects 1 to 4, wherein a content of the electrode base material in the inner electrode is from 40 to 98% by weight.

Aspect 6

The ceramic plate according to any one of aspects 1 to 5, wherein a content of the thermal expansion coefficient modifier in the inner electrode is from 1 to 40% by weight.

Aspect 7

The ceramic plate according to any one of aspects 1 to 6, wherein a content of Ti in the inner electrode is from 1 to 20% by weight.

Aspect 8

The ceramic plate according to any one of aspects 1 to 7, wherein the Ti diffusion region exists over a specified Ti diffusion distance from surfaces of both sides of the inner electrode, and the Ti diffusion distance is 20 µm or more.

Aspect 9

The ceramic plate according to any one of aspects 1 to 8, wherein an average grain size of ceramic crystal grains constituting a near-electrode region within 20 µm from surfaces of both sides of the inner electrode of the ceramic substrate is larger than an average grain size of ceramic crystal grains constituting a region other than the Ti diffusion region of the ceramic substrate.

Aspect 10

The ceramic plate according to any one of aspects 1 to 9, wherein an average grain size of ceramic crystal grains constituting a near-electrode region within 20 µm from surfaces of both sides of the inner electrode of the ceramic substrate is 2.0 times or more of an average grain size of ceramic crystal grains constituting a region other than the Ti diffusion region of the ceramic substrate.

Aspect 11

The ceramic plate according to any one of aspects 1 to 10, wherein diffusion of Ti in the Ti diffusion region has been brought about by firing of the inner electrode containing Ti.

Aspect 12

The ceramic plate according to any one of aspects 1 to 11, wherein the ceramic substrate is a sintered composite comprising aluminum oxide and magnesium oxide and/or magnesium-aluminum spinel.

DETAILED DESCRIPTION OF THE INVENTION

Ceramic Plate

Figure 1:
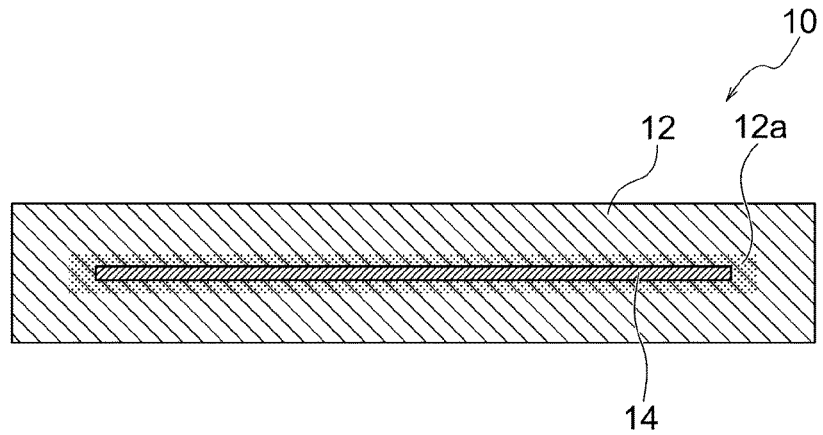
FIG. 1 is a schematic cross-sectional view showing an aspect of a ceramic plate according to the present invention.

FIG. 1 shows an aspect of a ceramic plate according to the present invention. The ceramic plate 10 shown in FIG. 1 includes a ceramic substrate 12 and an inner electrode 14. The ceramic substrate 12 contains aluminum oxide and/or aluminum nitride. The inner electrode 14 is embedded inside the ceramic substrate and contains an electrode base material, a thermal expansion coefficient modifier, and Ti. The ceramic substrate 12 has a Ti diffusion region 12a in which Ti is diffused around the inner electrode 14. Thus, by containing Ti in materials constituting the inner electrode 14 and by forming the Ti diffusion region in which Ti is diffused around the inner electrode 14, adhesive strength between the ceramic substrate 12 and the inner electrode 14 can be improved.

As described above, to ensure high performance in semiconductor manufacturing device applications such as susceptors, it is desired to increase the adhesive strength between the ceramic substrate and the inner electrode embedded therein. For example, if the adhesive strength between the ceramic substrate and the inner electrode is weak, detachment or cracking may occur. In this regard, it is considered that one possible method to increase the adhesive strength between the ceramic substrate and the inner electrode is to add a ceramic material in the inner electrode, but it is not possible to add more ceramic material than necessary because resistance of the electrode will also increase. Now, according to the present invention, the adhesive strength between the ceramic substrate 12 and the inner electrode 14 can be improved by containing Ti as a metallic additive in the materials constituting the inner electrode 14. This is believed to be due to formation of the Ti diffusion region 12a in which Ti is diffused around the inner electrode 14 in the ceramic substrate 12. Further, since Ti is the metallic additive, the resistance of the electrode is also less likely to increase compared with a case that the ceramic material is added.

The ceramic substrate 12 contains the aluminum oxide and/or the aluminum nitride, preferably the aluminum oxide. The ceramic substrate 12 composed of such materials has excellent thermal conductivity, high electrical insulation, and a thermal expansion property and the like close to silicon. Therefore, the ceramic substrate 12 preferably contains the aluminum oxide and/or the aluminum nitride as major components (e.g., 50% by weight or more), more preferably from 90 to 100% by weight, even more preferably from 95 to 100% by weight, and particularly preferably from 99 to 100% by weight.

When the ceramic substrate 12 contains the aluminum oxide, the ceramic substrate 12 may further contain magnesium oxide (MgO) and/or magnesium-aluminum spinel ($MgAl_2O_4$) as additives. In other words, the ceramic substrate 12 may be a sintered composite containing the aluminum oxide and the magnesium oxide and/or the magnesium-aluminum spinel. Because the magnesium oxide reacts with the aluminum oxide during firing to change into the magnesium-aluminum spinel, a typical sintered composite contains the aluminum oxide and the magnesium-aluminum spinel. It is considered that in such a sintered composite, by reaction with Ti diffused from the inner electrode 14, an average grain size of ceramic crystal grains around the inner electrode 14 tends to be larger than an average grain size in other place, thereby contributing to improved adhesive strength between the ceramic substrate 12 and the inner electrode 14.

A ratio of a crystalline phase amount of $MgAl_2O_4$ to $Al_2O_3$ in the sintered composite containing the aluminum oxide ($Al_2O_3$) and the magnesium-aluminum spinel ($MgAl_2O_4$) (hereinafter also called "$MgAl_2O_4/Al_2O_3$ crystalline phase amount ratio") is preferably in a range from 0.003 to 0.01. The ratio of the crystalline phase amount of $MgAl_2O_4$ to $Al_2O_3$ herein is defined as a value obtained by dividing peak intensity of a (311) plane of the $MgAl_2O_4$ crystalline phase by peak intensity of a (113) plane of the $Al_2O_3$ crystalline phase, using measurement results of X-ray diffraction. As to a content of Mg in the sintered composite, there is no upper limit, but it is preferably 0.35% by weight or less, and more preferably 0.07% by weight or less.

The ceramic substrate 12 has the Ti diffusion region 12a in which Ti is diffused around the inner electrode 14. Diffusion of Ti in this Ti diffusion region 12a has been brought about by firing of the inner electrode containing Ti. As described above, the diffusion of Ti around the inner electrode 14 in the ceramic substrate 12 improves the adhesive strength between the ceramic substrate 12 and the inner electrode 14. Presence of the Ti diffusion region 12a can be confirmed by conducting elemental analysis by EPMA (electron probe microanalyzer) on a cross section of the ceramic plate 10 to obtain a Ti mapping image, according to the procedure described in Examples described later. The Ti diffusion region 12a is present across a specified Ti diffusion distance (see $L_{Ti}$ in FIG. 2B) from the surfaces of both sides of the inner electrode 14, but this Ti diffusion distance is preferably 20 μm or more, more preferably from 20 to 100 μm, and even more preferably from 50 to 75 μm. The Ti diffusion distance is obtained by measuring each distance $L_{Ti}$ from the surfaces of both sides of the inner electrode to each outer edge of the Ti diffusion region based on the Ti mapping image. The outer edge of the Ti diffusion region is identified as a straight line at a position where a ratio of a total length of line segments overlapping (crossing) Ti originated pixels occupied in an overall length (600 μm) of the straight line is 50% or less, when the straight line is drawn parallel to the inner electrode in a 430 μm×600 μm viewing area of the Ti mapping image and the straight line is shifted parallel to the straight line in the direction away from the inner electrode.

It is preferable that the average grain size of the ceramic crystal grains constituting a near-electrode region within 20 μm from the surfaces on both sides of the inner electrode 14 of the ceramic substrate 12 is larger than the average grain size of the ceramic crystal grains constituting a region other than the Ti diffusion region 12a of the ceramic substrate 12. In this way, the adhesive strength between the ceramic substrate 12 and the inner electrode 14 can be further improved. Specifically, the average grain size of the ceramic crystal grains constituting the near-electrode region within 20 μm from the surfaces on both sides of the inner electrode 14 of the ceramic substrate 12 is preferably 2.0 times or more of the average grain size of the ceramic crystal grains constituting the region other than the Ti diffusion region 12a of the ceramic substrate 12, more preferably from 2.0 to 10.0 times, and even more preferably from 2.0 to 7.0 times.

A thickness of the ceramic substrate 12 can be a thickness of a typical ceramic plate and is not limited, but can be typically from 1 to 10 mm, and more typically from 2 to 5 mm.

Preferable examples of the inner electrode 14 include an ESC electrode, a heater electrode, and an RF electrode. Two types of the inner electrodes 13 may be included within the ceramic substrate 12. The ESC electrode is an abbreviation for an electrostatic chuck (ESC) electrode, also called an electrostatic electrode. The ESC electrode is preferably a circular thin-layer electrode having a slightly smaller diameter than that of the ceramic plate 10, and may be, for example, a mesh-like electrode made into a sheet form obtained by weaving thin metal wires into a net form. The ESC electrode may be used as a plasma electrode. That is, by applying high frequency to the ESC electrode, the ESC electrode can also be used as the plasma electrode, and film deposition by the plasma CVD process can be conducted. The ESC electrode is connected to an ESC rod (not shown) for power supply, and the ESC rod is connected to an external power supply (not shown). The ESC electrode chucks a wafer placed on the surface of the ceramic plate 10 by Johnson-Rahbeck force when voltage is applied from the external power supply. The heater electrode is not limited, but can be, for example, a conductive coil wired in a single stroke fashion over an entire surface of the ceramic substrate 12. Heater rods (not shown) for power supply are connected to both ends of the heater electrode, and the heater rods are connected to a heater power supply (not shown). The heater electrode generates heat when power is supplied from the heater power supply to heat the wafer placed on the surface of the ceramic plate 10. The heater electrode is not limited to the coil, but may be, e.g., a ribbon (long, thin sheet) or a mesh. A ribbon-shaped heater electrode may be formed by a printing method. The inner electrode 14 is preferably used as the ESC electrode.

The inner electrode 14 contains an electrode base material, a thermal expansion coefficient modifier, and Ti. The electrode base material is not limited, if it is a common electrode material having a high melting point, such as high melting point metals and/or metal carbides. Examples of the electrode base material include preferably Mo, W, WC, MoC, Nb, NbC, Ru, and alloys thereof, more preferably Mo, W or WC, and even more preferably Mo. A content of the electrode base material in the inner electrode 14 is not limited, but is preferably from 40 to 98% by weight, and more preferably from 50 to 93% by weight.

A content of Ti in the inner electrode 14 is not limited if desired adhesion can be ensured to the extent that a function of the inner electrode 14 is not impaired, but preferably from 1 to 20% by weight, and more preferably from 3 to 20 by weight.

The thermal expansion coefficient modifier is a material used to reduce a thermal expansion coefficient difference between the inner electrode 14 and the ceramic substrate 12, and contributes to improvement of the adhesive strength between the ceramic substrate and the inner electrode. Thus, the thermal expansion coefficient modifier may be a ceramic material like the ceramic substrate 12. Therefore, the thermal expansion coefficient modifier preferably contains aluminum oxide and/or aluminum nitride. A content of the thermal expansion coefficient modifier in the inner electrode 14 is not particularly limited if the desired adhesion can be ensured to the extent that the function of the inner electrode 14 is not impaired, but preferably from 1 to 40% by weight, and more preferably from 4 to 35% by weight.

A thickness of the inner electrode 14 may be a thickness of an inner electrode embedded in a common ceramic plate, and is not limited, but is preferably from 1 to 50 μm, and more preferably from 5 to 30 μm.

Production Method

The ceramic plate of the present invention can be produced by placing a Ti-containing electrode or Ti-containing electrode paste inside a precursor member (green body, calcined body, or sintered body) of a ceramic substrate and firing it by a known method. In this way, Ti is diffused from the Ti-containing inner electrode to its surroundings, forming a Ti diffusion region around the inner electrode in the ceramic substrate. Therefore, the ceramic plate of the present invention can be produced in the same manner as known production methods as disclosed in Patent Literatures 1 to 3, except that Ti is contained in the inner electrode. For example, the ceramic plate of the present invention can be produced by preparing two precursor members (green body, calcined body, or sintered body) of the ceramic substrate, applying electrode paste containing the above-described electrode base material, the thermal expansion coefficient modifier and Ti to one precursor member, laminating the other precursor member on the precursor member coated with the electrode paste, and firing the resultant laminate by hot pressing and the like.

EXAMPLES

The present invention will be further specifically described with reference to the following Examples.

Examples 1 to 4

(1) Preparation of Ceramic Plate

A ceramic plate in which an inner electrode was embedded inside a ceramic substrate was prepared by the following procedures.

(1a) Preparation of Calcined Ceramic Body

A ceramic raw material powder was obtained by weighing and mixing 99.9 parts by weight of commercially available $Al_2O_3$ powder (purity: 99.99% or more, average particle size D50: from 0.4 to 0.6 μm) and 0.1 part by weight of commercially available MgO powder (purity: 99.9% or more, average particle size D50: 1 μm or less). To this ceramic raw material powder, a binder (polyvinyl alcohol (PVA)), water, a dispersing agent, etc., were added and mixed for a specified time (e.g., 16 hours) in a trommel, to prepare a slurry. The resultant slurry was spray dried in a spray dryer to obtain granulated alumina powder. The granulated alumina powder was uniaxially pressurized and compacted under pressure of from 25 to 500 kgf/cm$^2$, to form a disk-shaped compact having 350 mm in diameter and 5 mm in thickness. This disk-shaped compact could be degreased and then calcined at from 750 to 900° C. for 1 to 4 hours, to prepare a calcined ceramic body. Thus, two plates of the calcined ceramic bodies were prepared for each Example.

(1b) Formation of Laminate

Commercially available Mo powder (purity: 99.9%, average particle size D50: from 1 to 2 μm), commercially available Ti powder (purity: 99.9%, average particle size D50: from 3 to 4 μm), and commercially available Al$_2$O$_3$ powder (purity: 99.99%, average particle size D50: from 0.4 to 0.6 μm) were weighed to be a blending ratio as shown in Table 1, and after wet mixing in a ball mill, they were kneaded together with a solvent (terpineol) and a binder (polymethacrylate-i-butyl) to prepare electrode paste. The resultant electrode paste was applied to a top surface of one calcined ceramic body by screen printing and dried. Then, another calcined ceramic body was laminated on the calcined ceramic body on which the dried electrode paste had been applied, thereby forming a laminate with an electrode paste layer sandwiched between the two calcined ceramic bodies.

(1c) Firing of Laminate

Thus, the formed laminate was placed in dice for hot pressing. The laminate in the dice for hot pressing was fired by hot pressing under a vacuum atmosphere. The hot pressing was conducted by holding the laminate at a pressing pressure of 250 kgf/cm$^2$, and at a maximum temperature of 1,600° C. for 8 hours. Thus, a ceramic plate in which inner electrode was embedded inside the ceramic substrate, was obtained.

(2) Evaluation of Ceramic Plate

The following various evaluations were conducted on the ceramic plates prepared.

<Acquisition of Ti Mapping Image by EPMA>

Figure 2A:
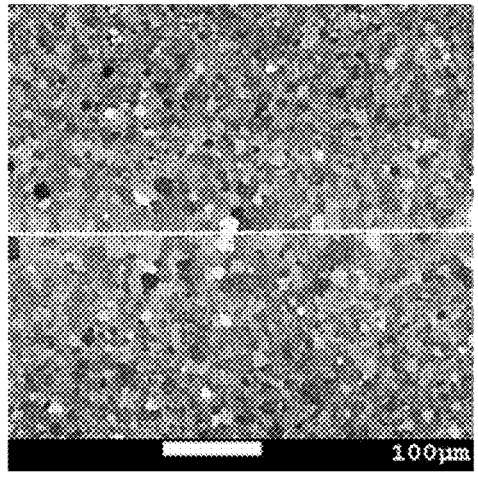
FIG. 2A shows a cross-sectional SEM image of a ceramic plate sample of Example 2.
Figure 2B:
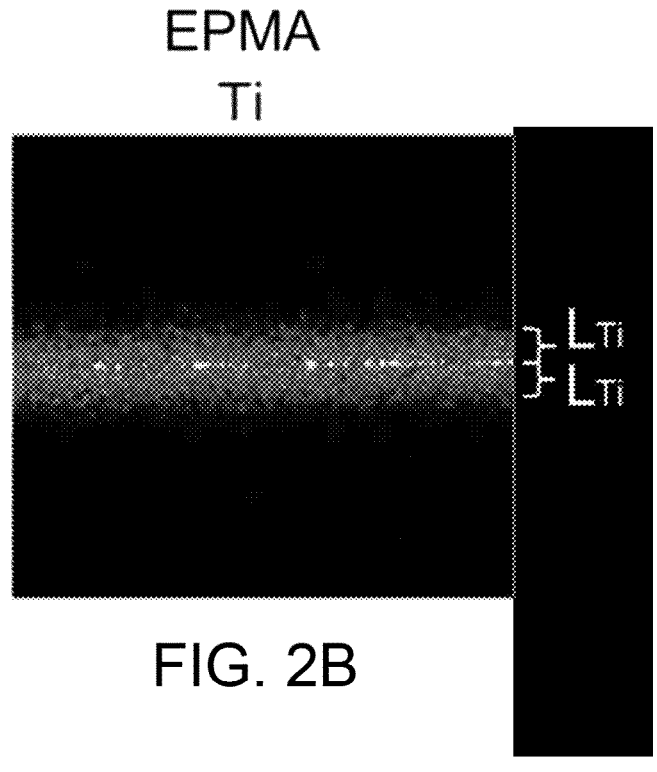
FIG. 2B shows a Ti mapping image by EPMA of Example 2 measured for a region corresponding to the cross-sectional SEM image in FIG. 2A.

A cross section of the ceramic plate was cut out, mirror polished, and then subjected to flat ion milling with Ar ions, to obtain a cross section for observation. The resultant cross section for observation was observed by SEM (Scanning Electron Microscope), as well as on the cross section, elemental analysis was conducted by EPMA (Electron Probe Micro Analyzer, product name: JXA-8530FPlus, produced by JEOL Ltd.) under a measurement condition of an acceleration voltage of 15 kV, to obtain a Ti mapping image. By comparing the obtained cross-sectional SEM image with the Ti mapping image, it was confirmed that there was a Ti diffusion region in which Ti was diffused around the inner electrode in each sample of Examples 2 to 4. On the other hand, such a Ti diffusion region was not observed in a sample of Example 1 (Comparative Example). FIG. 2A shows the cross-sectional SEM image of Example 2, while FIG. 2B shows the Ti mapping image by EPMA of Example 2 measured for the region corresponding to the cross-sectional SEM image in FIG. 2A. For each sample of Examples 2 to 4, each distance L$_{Ti}$ (Ti diffusion distance L$_{Ti}$) from the surfaces of both sides of the inner electrode to each outer edge of the Ti diffusion region was measured based on the Ti mapping image. The Ti diffusion distances, L$_{Ti}$, two in total, were obtained for a top side and a bottom side of the inner electrode in the Ti mapping image, but they were approximately the same value. One of the values obtained is shown in Table 1. The outer edge of the Ti diffusion region in the Ti mapping image was identified as a straight line at a position where a ratio of the total length of the line segments overlapping (crossing) Ti originated pixels occupied in an overall length (600 μm) of the straight line was 50% or less, when the straight line was drawn parallel to the inner electrode in a 430 μm×600 μm viewing area of the Ti mapping image and shifted parallel in the direction away from the inner electrode.

<Compositional Analysis of Ceramic Substrate>

The ceramic substrate was pulverized in a mortar to obtain powder. The crystalline phase of the powder was identified by an X-ray diffractometer (XRD). The measurement conditions were CuKα, 40 kV, 40 mA, and 2θ=from 10 to 70°, and an enclosed tube X-ray diffractometer (produced by Bruker AXS Corporation, D8-ADVANCE) was used. A step width for measurement was 0.02°. When a content of a constituent phase was small and peaks could not be detected by X-ray diffraction, the presence of the constituent phase was confirmed by microstructural observation using SEM (scanning electron microscope) and EDX (energy dispersive X-ray analysis). As a result, in all of Examples 1 to 4, it was seen that the ceramic substrate was composed of Al$_2$O$_3$ and MgAl$_2$O$_4$ crystalline phases. In addition, by dividing the peak intensity of a (311) plane of the MgAl$_2$O$_4$ crystalline phase by the peak intensity of a (113) plane of the Al$_2$O$_3$ crystalline phase, the MgAl$_2$O$_4$/Al$_2$O$_3$ crystalline phase amount ratio in the ceramic substrate was determined, and the result was 0.004. A content of Mg in the ceramic substrate was determined by an analysis method in accordance with JIS R1649, and the result was 0.07% by weight.

<Average Grain Size>

For each region of the near-electrode regions within 20 μm from the surfaces of both sides of the inner electrode of the ceramic substrate and of the regions other than the Ti diffusion region in the ceramic substrate, the average grain sizes of the ceramic crystal grains such as the Al$_2$O$_3$ crystal grain were measured by an intercept method. Specifically, the ceramic substrate was polished by a cross-section polisher (CP) (produced by JEOL Ltd., IB-15000CP), and the resultant polished cross section (cross section perpendicular to the main surface of the inner electrode) was photographed with a field of view of 500 times (190 μm×250 μm). By drawing an arbitrary number of line segments in the near-electrode region of the SEM image in which this polished cross section was observed, number of crystalline grains, n, crossed by a line segment of length L was determined. If one end of the line segment was located inside a crystal grain, the crystal grain was counted as ½ of the grain. The value obtained by dividing the length L of the line segment by n was designated as an average intercept length l, and the l was multiplied by a coefficient of 1.5 to determine the average grain size A of the ceramic crystal grains. For regions other than the Ti diffusion region in the SEM image which observed this polished cross section of the ceramic substrate, the average grain size B of the ceramic crystal grains was also determined in the same manner as described above. The results are shown in Table 1, which also shows A/B ratios.

<Adhesive Strength>

A ceramic plate was prepared as in the ceramic plate prepared in the above (1), except that a thickness of the ceramic plate and an application shape of the electrode paste were different, and the adhesive strength between the ceramic substrate and the inner electrode was measured. Specifically, the methods are as follows.

(i) Preparation of Ceramic Plate

Two plates of calcined ceramic bodies of 350 mm in diameter and 20 mm in thickness were prepared in the same manner as in the above (1a) except for thickness. On one calcined ceramic body, the electrode pastes prepared in the above (1b) was applied in a circular shape, slightly smaller in diameter than the calcined ceramic body, with a thickness of 10 μm. On the calcined ceramic body to which the electrode paste had been applied, by laminating another calcined ceramic body, a disc-shaped laminate having 350 mm in diameter and 40 mm in thickness was obtained. The resultant laminate was fired in the same manner as in the above (1c), to obtain a disc-shaped ceramic plate. From the ceramic plate obtained, five columnar test pieces of 9.9 mm in diameter having the central axis in a thickness direction was interposed from above and below, and upward and downward loads were applied to the jig element 22 and jig element 24, respectively. Thus, a shear load was applied to the inner electrode 14. This shear load was gradually increased, and it was lasted to increase the shear load until the inner electrode 14 or any of its left and right parts (i.e., the ceramic substrate 12) of the columnar test piece 10' was fractured. The adhesive strength of the inner electrode 14 was determined by dividing the maximum load measured at this time by a cross-sectional area perpendicular to the central axis direction C of the inner electrode 14. The results are shown in Table 1.

TABLE 1

| | Ceramic Subsrate Major Component | Electrode Base Material Component | % by weight | Additive Component | % by weight | Thermal Expansion Coefficient Modifier Component | % by weight | Ti Diffusion Distance (μm) | Near-Electrode Region A (μm) | Other Than Ti Diffusion Region B (μm) | Ratio A/B | Adhesive Strentth between Ceramic Substrate and Inner Electrode (MPa) |
|---|---|---|---|---|---|---|---|---|---|---|---|---|
| | Blending Ratio of Inner Electrode | | | | | | | | Average Grain Size of Ceramic Crystal Grains Region B | | | |
| Ex. 1* | $Al_2O_3$ | Mo | 91 | — | — | $Al_2O_3$ | 9 | — | 9 | 9 | 1.0 | 102 |
| Ex. 2 | $Al_2O_3$ | Mo | 87 | Ti | 4 | $Al_2O_3$ | 9 | 25 | 18 | 8 | 2.3 | 113 |
| Ex. 3 | $Al_2O_3$ | Mo | 83 | Ti | 9 | $Al_2O_3$ | 8 | 50 | 18 | 9 | 2.0 | 141 |
| Ex. 4 | $Al_2O_3$ | Mo | 75 | Ti | 17 | $Al_2O_3$ | 8 | 70 | 46 | 7 | 6.6 | 135 |

Figure 3:
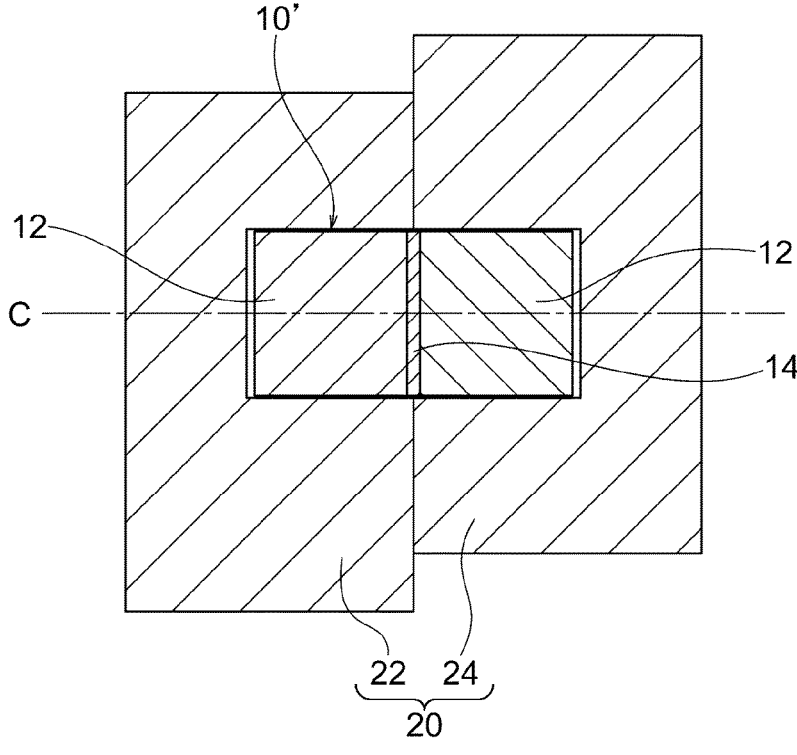
FIG. 3 is a schematic cross-sectional view showing a jig, in which a test piece is incorporated, used to measure adhesive strength between a ceramic substrate and an inner electrode.

*represents Comparative Example.

of the ceramic plate were cut out. Reference positions for cutting out each columnar test piece in the ceramic plate (i.e., the position of the center axis of each columnar test piece) were the center of the disc-shaped ceramic plate and four positions arranged at equal angular intervals in a circumferential direction on the same circumference around this center. As shown in FIG. 3, each columnar test piece 10' had a disc-shaped inner electrode 14 in the center of the central axial direction C, wherein the inner electrode 14 was sandwiched between two ceramic substrates 12. In this columnar test piece 10', the inner electrode 14 was formed over the entire surface of one side of each ceramic substrate 12.

(ii) Measurement of Adhesive Strength

As shown in FIG. 3, prepared was a jig 20 having two horizontally adjacent jig elements 22, 24 and an inner space of approximately the same shape and dimensions as the columnar test piece 10'. This jig 20 was configured such that a bottom surface of the jig element 22 protruded below a bottom surface of the jig element 24 and a top surface of the jig element 24 protruded above a top surface of the jig element 22. Next, a columnar test piece 10', arranged so that the central axis direction C was horizontal, was accommodated in the inner space of the jig 20. A part of the columnar test piece 10' to the left of the inner electrode 14 was accommodated inside the jig element 22, and a part of the columnar test piece 10' to the right of the inner electrode 14 was accommodated inside the jig element 24. Thus, boundary surfaces (contact surfaces) of the jig element 22 and the jig element 24, which were in surface contact with each other, were located at the same position in the central axial direction C as the inner electrode 14 of the columnar test piece 10'. The jig 20 accommodating the columnar test piece 10' was set in a material testing machine (Autograph AG-10TD, produced by Shimadzu Corporation) so that it

What is claimed is:

1. A ceramic plate comprising:
   a ceramic substrate comprising aluminum oxide and/or aluminum nitride; and
   an inner electrode embedded inside the ceramic substrate, the inner electrode comprising an electrode base material, a thermal expansion coefficient modifier, and Ti,
   wherein the ceramic substrate comprises a Ti diffusion region in which Ti is diffused around the inner electrode,
   wherein the electrode base material is at least one selected from the group consisting of Mo, W, WC, MoC, Nb, and NbC, and
   wherein a content of the electrode base material in the inner electrode is from 40 to 98% by weight.

2. The ceramic plate according to claim 1, wherein the electrode base material is at least one selected from the group consisting of Mo, W, WC, and MoC.

3. The ceramic plate according to claim 1, wherein the electrode base material is Mo.

4. The ceramic plate according to claim 1, wherein the thermal expansion coefficient modifier comprises aluminum oxide and/or aluminum nitride.

5. The ceramic plate according to claim 1, wherein a content of the thermal expansion coefficient modifier in the inner electrode is from 1 to 40% by weight.

6. The ceramic plate according to claim 1, wherein a content of Ti in the inner electrode is from 1 to 20% by weight.

7. The ceramic plate according to claim 1, wherein the Ti diffusion region exists over a specified Ti diffusion distance from surfaces of both sides of the inner electrode, and the Ti diffusion distance is 20 μm or more.

8. The ceramic plate according to claim 1, wherein an average grain size of ceramic crystal grains constituting a near-electrode region within 20 μm from surfaces of both sides of the inner electrode of the ceramic substrate is larger than an average grain size of ceramic crystal grains constituting a region other than the Ti diffusion region of the ceramic substrate.

9. The ceramic plate according to claim 1, wherein an average grain size of ceramic crystal grains constituting a near-electrode region within 20 μm from surfaces of both sides of the inner electrode of the ceramic substrate is 2.0 times or more of an average grain size of ceramic crystal grains constituting a region other than the Ti diffusion region of the ceramic substrate.

10. The ceramic plate according to claim 1, wherein diffusion of Ti in the Ti diffusion region has been brought about by firing of the inner electrode containing Ti.

11. The ceramic plate according to claim 1, wherein the ceramic substrate is a sintered composite comprising aluminum oxide and magnesium oxide and/or magnesium-aluminum spinel.

* * * * *